(12) United States Patent
Kim et al.

(10) Patent No.: US 12,721,217 B2
(45) Date of Patent: Aug. 25, 2026

(54) SEMICONDUCTOR PACKAGE AND METHOD OF MANUFACTURING THE SAME

(71) Applicant: Samsung Electronics Co., Ltd., Suwon-si (KR)

(72) Inventors: Dongkyu Kim, Anyang-si (KR); Jongyoun Kim, Seoul (KR); Seokhyun Lee, Hwaseong-si (KR); Minjung Kim, Cheonan-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 366 days.

(21) Appl. No.: 17/706,978

(22) Filed: Mar. 29, 2022

(65) Prior Publication Data

US 2023/0056041 A1 Feb. 23, 2023

(30) Foreign Application Priority Data

Aug. 20, 2021 (KR) ........................ 10-2021-0110044

(51) Int. Cl.

*H01L 25/18* (2023.01)
*H01L 23/31* (2006.01)
*H01L 23/538* (2006.01)
(Continued)

(52) U.S. Cl.

CPC .......... *H10W 90/00* (2026.01); *H10W 70/611* (2026.01); *H10W 70/685* (2026.01);
(Continued)

(58) Field of Classification Search

CPC ....... H01L 25/0657; H01L 2225/06568; H01L 23/5383; H01L 23/5385; H01L 23/522; H01L 23/5384; H01L 2225/06548
See application file for complete search history.

(56) References Cited

U.S. PATENT DOCUMENTS 7,851,894 B1 * 12/2010 Scanlan ................ H01L 23/552
257/E23.116
8,293,574 B2 10/2012 Mihara
(Continued)

FOREIGN PATENT DOCUMENTS

CN 107910307 A 4/2018
CN 110473792 A 11/2019
(Continued)

*Primary Examiner* — Lawrence C Tynes, Jr.
(74) *Attorney, Agent, or Firm* — Wolf, Greenfield & Sacks, P.C.

(57) ABSTRACT

A semiconductor package includes: a base substrate including a lower redistribution layer; a lower semiconductor chip including a first active surface and on the base substrate; an upper semiconductor chip including a second active surface on the lower semiconductor chip and having an area larger than that of the lower semiconductor chip; an intermediate connection member including an upper redistribution layer on the second active surface of the upper semiconductor chip between the lower and upper semiconductor chips; a plurality of vertical interconnectors disposed around the lower semiconductor chip on the base substrate and connecting the lower redistribution layer and the upper redistribution layer; and a molding portion on the base substrate and including a first portion surrounding the lower semiconductor chip and the vertical interconnectors, and a second portion extending upwardly from the first portion and on side surfaces of the upper semiconductor chip and the intermediate connection member.

19 Claims, 16 Drawing Sheets

(51) Int. Cl.

| | |
|---|---|
| ***H10W 70/60*** | (2026.01) |
| ***H10W 70/685*** | (2026.01) |
| ***H10W 74/10*** | (2026.01) |
| ***H10W 90/00*** | (2026.01) |

(52) U.S. Cl.

CPC ....... *H10W 74/131* (2026.01); *H10W 90/401* (2026.01); *H10W 90/701* (2026.01); *H10W 90/724* (2026.01)

(56) References Cited

U.S. PATENT DOCUMENTS

| | | | | |
|---|---|---|---|---|
| 8,299,595 | B2 * | 10/2012 | Yoon | H01L 23/552 438/109 |
| 8,421,211 | B2 | 4/2013 | Kang et al. | |
| 2008/0157328 | A1 * | 7/2008 | Kawata | H01L 21/561 438/109 |
| 2015/0318267 | A1 * | 11/2015 | Yu | H01L 21/02271 257/774 |
| 2016/0155731 | A1 | 6/2016 | Tung et al. | |
| 2017/0098634 | A1 * | 4/2017 | Kumar | H01L 25/50 |
| 2019/0267351 | A1 | 8/2019 | Jo et al. | |
| 2020/0381397 | A1 * | 12/2020 | Yu | H01L 24/08 |
| 2021/0020602 | A1 * | 1/2021 | Chen | H01L 23/3128 |
| 2021/0082782 | A1 * | 3/2021 | Wang | H01L 21/6835 |

FOREIGN PATENT DOCUMENTS

| | | | |
|---|---|---|---|
| CN | 112490186 | A | 3/2021 |
| JP | 6511695 | B2 | 4/2019 |
| KR | 20010025861 | A | 4/2001 |
| KR | 20010073344 | A | 8/2001 |
| KR | 20090011743 | A | 2/2009 |
| KR | 20130077033 | A | 7/2013 |
| KR | 20190102534 | A | 9/2019 |

* cited by examiner

SEMICONDUCTOR PACKAGE AND METHOD OF MANUFACTURING THE SAME

CROSS-REFERENCE TO RELATED APPLICATION(S)

This application claims benefit of priority to Korean Patent Application No. 10-2021-0110044 filed on Aug. 20, 2021 in the Korean Intellectual Property Office, the disclosure of which is incorporated herein by reference in its entirety.

BACKGROUND

The present disclosure relates to a semiconductor package and a method of manufacturing the same.

Recently, demand for portable devices has rapidly increased in the electronic products market, and as a result, miniaturization and weight reduction of electronic components mounted in electronic products are being continuously pursued. To reduce the size and weight of electronic components, semiconductor packages mounted thereon may need to retain the ability to process high-capacity data while volumes thereof are reduced. There is a need for high integration and single packaging of semiconductor chips mounted in such semiconductor packages. Accordingly, a semiconductor package having a stack structure may be utilized to allow semiconductor chips to be efficiently arranged within a limited semiconductor package structure.

SUMMARY

Example embodiments provide a semiconductor package which may maintain reliability (for example, improvement of heat dissipation performance) while efficiently arranging a plurality of semiconductor chips and a redistribution structure connecting the plurality of semiconductor chips.

Example embodiments provide a method of manufacturing a semiconductor package which may maintain reliability (for example, improvement of heat dissipation performance) while efficiently arranging a plurality of semiconductor chips and a redistribution structure connecting the plurality of semiconductor chips.

According to an example embodiment, a semiconductor package includes: a base substrate including a lower redistribution layer; a lower semiconductor chip including a first active surface with first connection pads thereon, the lower semiconductor chip on the base substrate such as the first active surface faces an upper surface of the base substrate, each of the first connection pads being connected to the lower redistribution layer; an upper semiconductor chip including a second active surface with second connection pads thereon, the upper semiconductor chip on the lower semiconductor chip such that the second active surface faces the lower semiconductor chip, the upper semiconductor chip having an area larger than an area of the lower semiconductor chip; an intermediate connection member including an upper redistribution layer on the second active surface of the upper semiconductor chip between the lower semiconductor chip and the upper semiconductor chip and connected to the second connection pads; a plurality of vertical interconnectors disposed around the lower semiconductor chip on the base substrate and connecting the lower redistribution layer and the upper redistribution layer; and a molding portion on the base substrate and including a first portion surrounding the lower semiconductor chip and the plurality of vertical interconnectors, and a second portion extending from the first portion and on side surfaces of the upper semiconductor chip and the intermediate connection member.

According to an example embodiment, a semiconductor package includes: a base substrate including a lower redistribution layer; a lower semiconductor chip including a first active surface with first connection pads thereon and a first inactive surface opposite the first active surface, the lower semiconductor chip on the base substrate such that the first active surface faces the base substrate, the first connection pads being connected to the lower redistribution layer; an upper semiconductor chip having an area larger than an area of the lower semiconductor chip and including a second active surface with second connection pads thereon and a second inactive surface opposite the second active surface, the upper semiconductor chip on the lower semiconductor chip such that the second active surface faces the lower semiconductor chip; an intermediate connection member including an upper redistribution layer on the second active surface of the upper semiconductor chip between the lower semiconductor chip and the upper semiconductor chip and connected to each of the second connection pads; a plurality of vertical interconnectors disposed around the lower semiconductor chip on the base substrate and connecting the lower redistribution layer and the upper redistribution layer to each other; and a molding layer on the base substrate surrounding the lower semiconductor chip and the plurality of vertical interconnectors and extending upwardly along side surfaces of the upper semiconductor chip and the intermediate connection member, the molding layer including an upper surface that is substantially coplanar with the second inactive surface of the upper semiconductor chip.

According to an example embodiment, a semiconductor package includes: a first semiconductor chip including a first surface with first connection pads thereon and a second surface opposite the first surface; a first connection member on the first surface of the first semiconductor chip and including a first redistribution layer electrically connected to the first connection pads, the first connection member having the same area as the first semiconductor chip; a second semiconductor chip including a first surface with second connection pads thereon and a second surface opposite the first surface and bonded to one region of the first connection member; a second connection member on the second surface of the second semiconductor chip and including a second redistribution layer electrically connected to the second connection pads, the second connection member having an area larger than an area of the first semiconductor chip; a plurality of vertical interconnectors disposed around the second semiconductor chip on the second connection member and connecting the first redistribution layer and the second redistribution layer to each other; and a molding portion on the second connection member surrounding the second semiconductor chip and the plurality of vertical interconnectors and extending upwardly on side surfaces of the first semiconductor chip and the first connection member.

According to an example embodiment, a method of manufacturing a semiconductor package includes: providing a wafer including a first surface with a plurality of first semiconductor chips thereon and a second surface opposite the first surface, each of the plurality of first semiconductor chips including first connection pads on the first surface; forming a first connection member on the first surface of the wafer, the first connection member including a first redistribution layer electrically connected to the first connection pads; forming a plurality of vertical interconnectors on regions corresponding to the plurality of first semiconductor chips in the first connection member, each of the plurality of vertical interconnectors being electrically connected to the first redistribution layer; partially cutting the wafer to be divided into the plurality of first semiconductor chips, the first connection member being divided into the regions corresponding to the plurality of first semiconductor chips; placing a second semiconductor chip on the regions corresponding to the plurality of first semiconductor chips in the first connection member, the second semiconductor chip including second connection pads and being disposed such that the second connection pads are directed upwardly; forming a molding layer including an upper surface on which the plurality of vertical interconnectors and the second connection pads are exposed, the molding layer including a filling portion that fills a space created by the partially cutting the wafer; forming a second connection member on the molding layer, the second connection member including a second redistribution layer connected to the plurality of vertical interconnectors and the second connection pads; performing a grinding process on the second surface of the wafer to expose the filling portion of the molding layer; and cutting the wafer in units of the plurality of first semiconductor chips to obtain a plurality of semiconductor packages.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
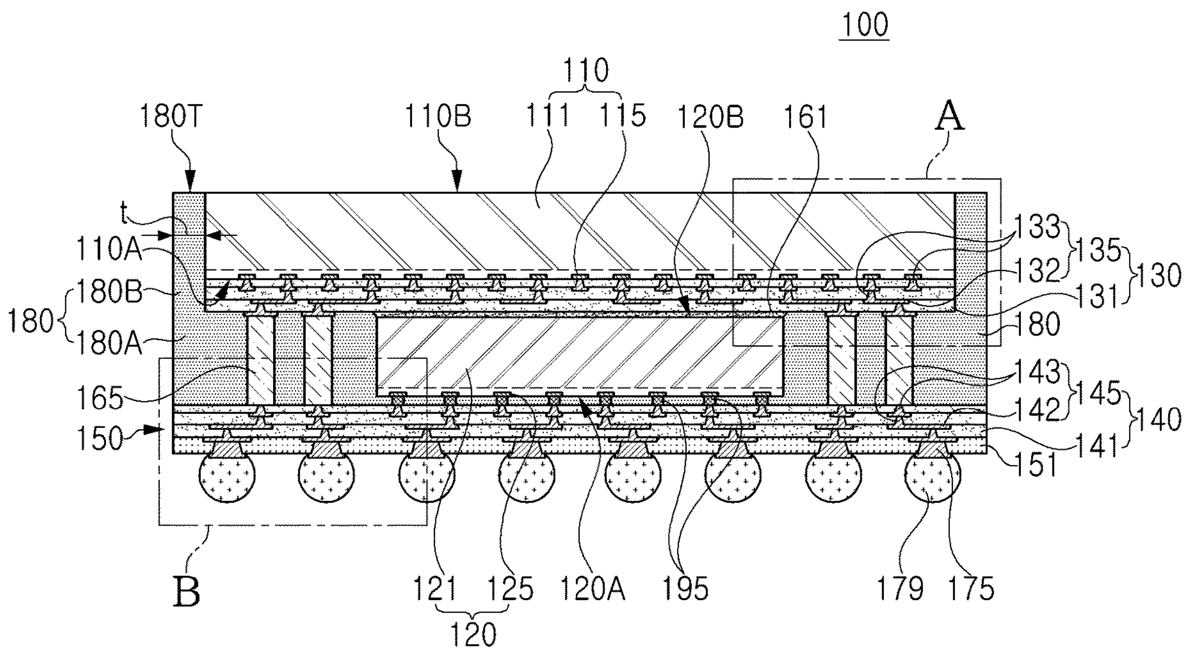
FIG. 1 is a side cross-sectional view of a semiconductor package according to an example embodiment.
Figure 2:
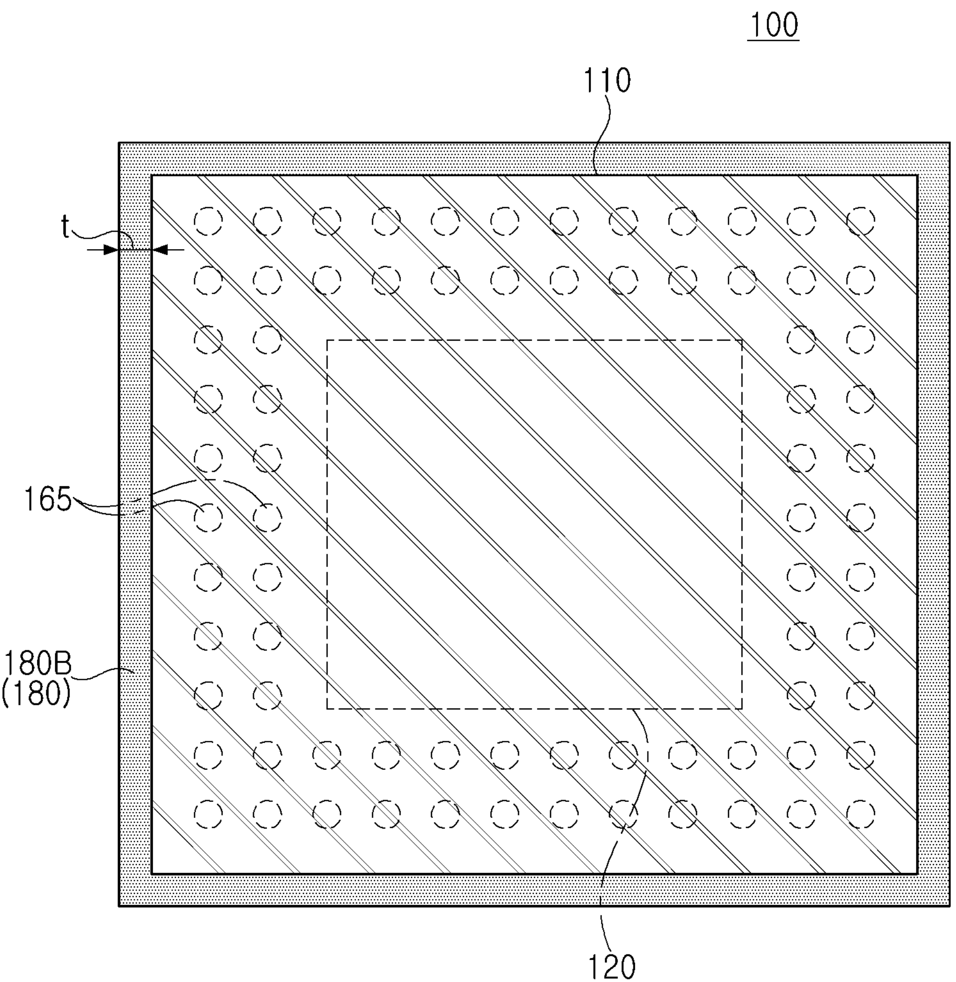
FIG. 2 is a plan view of the semiconductor package illustrated in FIG. 1.

FIG. 1 is a side cross-sectional view of a semiconductor package according to an example embodiment, and FIG. 2 is a plan view of the semiconductor package illustrated in FIG. 1.

Referring to FIGS. 1 and 2, a semiconductor package 100 according to the present embodiment may include a base substrate 150, a lower semiconductor chip 120 disposed on the base substrate 150, an upper semiconductor chip 110 disposed on the lower semiconductor chip 120, and a molding layer or portion 180 disposed on the base substrate 150 and surrounding the upper semiconductor chip 110.

The upper semiconductor chip 110 (also referred to as a "first semiconductor chip") may have an active surface 110A, on which connection pads 115 are arranged, and an inactive surface 110B opposite the active surface 110A. The upper semiconductor chip 110 may be disposed on the lower semiconductor chip 120 such that the active surface 110A is directed toward or faces the lower semiconductor chip 120. The upper semiconductor chip 110 may have an area larger than that of the lower semiconductor chip 120 (see FIG. 2).

Figure 3A:
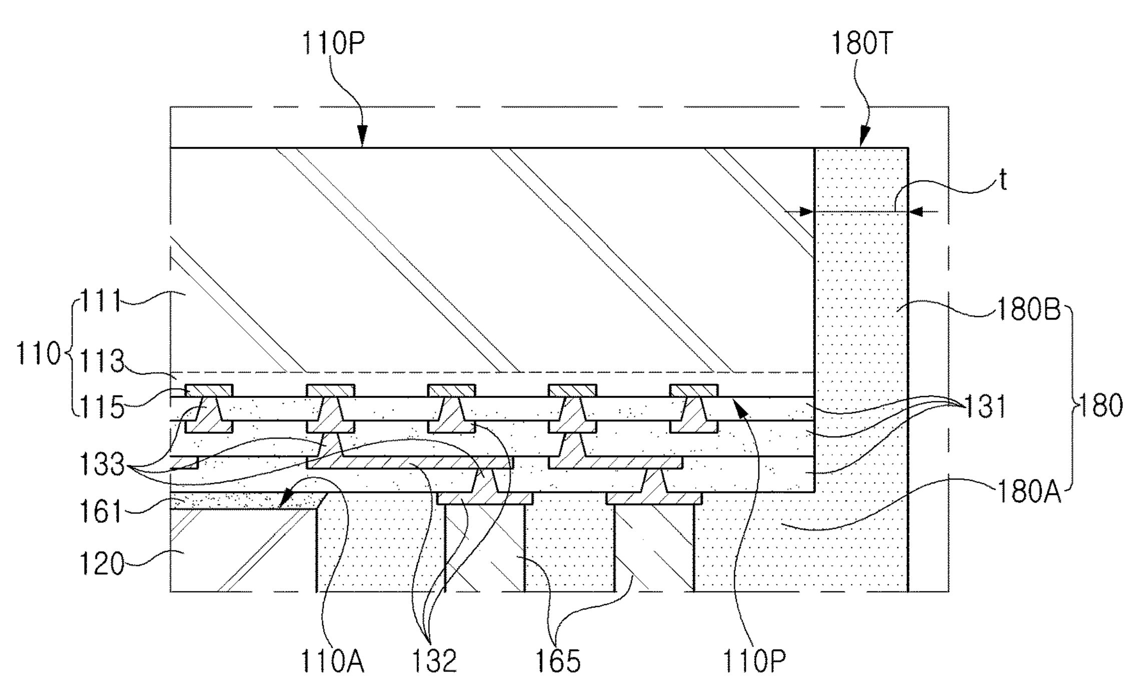
FIGS. 3A and 3B are partially enlarged views of portion "A" and portion "B" of the semiconductor package illustrated in FIG. 1, respectively.

A first connection member (also referred to as an "intermediate connection member") 130 may be disposed on the active surface 110A of the upper semiconductor chip 110. Referring to FIG. 3A together with FIG. 1, the first connection member 130 may include a plurality of insulating layers 131 and an upper redistribution layer (also referred to as a "first redistribution layer") 135 disposed on the plurality of insulating layers 131. The upper redistribution layer 135 may include redistribution patterns 132, respectively disposed on the plurality of insulating layers 131, and a plurality of vias 133 penetrating through each of the insulating layers 131 to connect adjacent redistribution patterns 132 to each other. Among the plurality of vias 133, some vias 133 may be directly connected to the connection pads 115. As described above, in the present embodiment, the upper semiconductor chip 110 may be directly connected to the upper redistribution layer 135 through the via 133 of the upper redistribution layer 135 without an external connection conductive material such as a solder. Each of the plurality of vias 133 may have a width that decreases in a direction toward the active surface 110A of the upper semiconductor chip 110.

The first connection member 130 may have an area corresponding to the active surface 110A of the upper semiconductor chip 110 (see FIG. 2). In some embodiments, the first connection member 130 may have a side surface that is coplanar or substantially coplanar with the side surface of the upper semiconductor chip 110.

As illustrated in FIG. 1, the first connection member 130 may be disposed between the lower semiconductor chip 120 and the upper semiconductor chip 110. The lower semiconductor chip 120 may be disposed on one region of the first connection member 130. As illustrated in FIG. 2, the lower semiconductor chip 120 may be disposed on a substantially central region of the first connection member 130.

The lower semiconductor chip (also referred to as a "second semiconductor chip") 120 may have an active surface 120A, on which connection pads 125 are arranged, and an inactive surface 120B opposite the active surface 120A. The semiconductor package 100 may further include a bonding layer 161 disposed between the inactive surface 120B of the lower semiconductor chip 120 and the first connection member 130. For example, the bonding layer 161 may include a direct adhesive film (DAF) or a film over wire (FOW).

The lower semiconductor chip 120 may be disposed on one region of the base substrate 150 such that the active surface 120A of the lower semiconductor chip 120 is directed toward or faces the upper surface of the base substrate 150. The base substrate 150 may include a second connection member 140 having a lower redistribution layer (also referred to as a "second redistribution layer") 145. Each of the connection pads 125 of the lower semiconductor chip 120 may be connected to the lower redistribution layer 145.

Figure 3B:
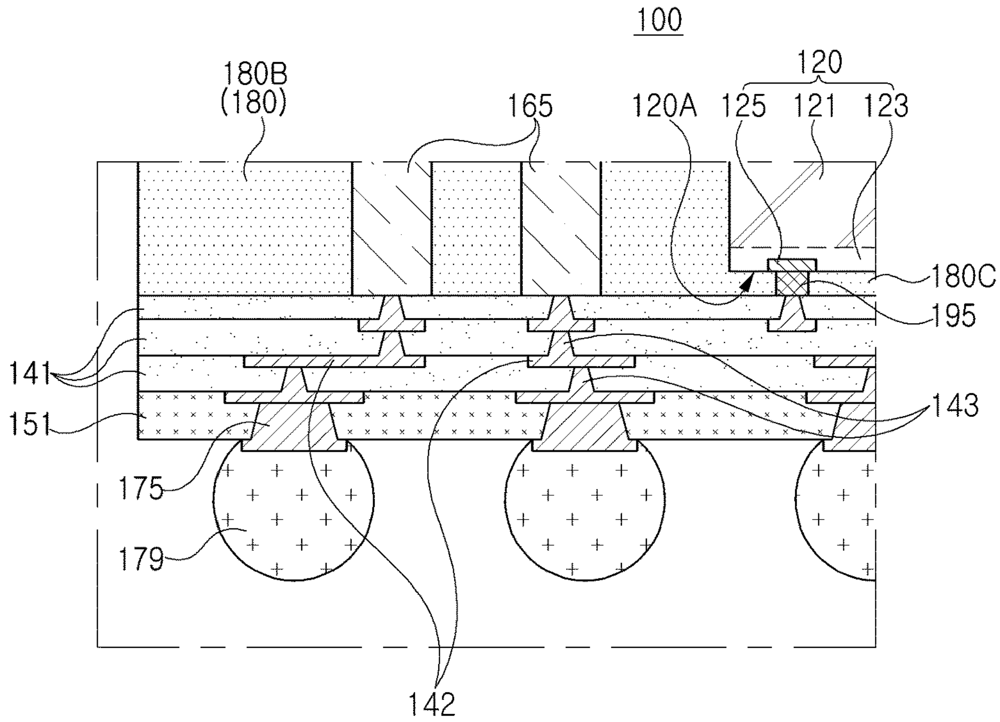

Referring to FIG. 3B together with FIG. 1, similar to the first connection member 130, the second connection member 140 may include a plurality of insulating layers 141 and, similar to the upper redistribution layer 135, the lower redistribution layer 145 may include redistribution patterns 142, respectively disposed on the plurality of insulating layers 141, and a plurality of vias 143 penetrating through each of the insulating layers 141 to connect adjacent redistribution patterns 142 to each other. Among the plurality of vias 143, some vias 143 may be connected to the connection pads 125. Each of the plurality of vias 143 may have a width that decreases in a direction toward the active surface 120A of the lower semiconductor chip 120.

In the present embodiment, the first and second connection members 130 and 140 are illustrated as respectively including three insulating layers 131 and 141 and three redistribution layers 135 and 145. However, in another embodiment, the first and second connection members 130 and 140 may be respectively implemented with one or two layers, or more layers, and the first and second connection members 130 and 140 may be implemented with a different number of redistribution layers. The insulating layers 131 and 141 may be formed of a photosensitive insulating material such as a photoimageable dielectric (PID) resin. Even when each of the insulating layers 131 and 141 includes multiple layers, a boundary between the multiple layers may not be apparent depending on a material and a process of each insulating layer. For example, the upper and lower redistribution layers 135 and 145 may include a conductive material such as copper (Cu), aluminum (Al), silver (Ag), tin (Sn), gold (Au), nickel (Ni), lead (Pb), titanium (Ti), or alloys thereof. When the upper and lower redistribution layers 135 and 145 are formed, the vias 133 and 143 may be formed to be integrated with the redistribution patterns 132 and 142 through the same process (for example, a plating process), respectively.

In the present embodiment, the base substrate 150 or the second connection member 140 may have an area larger than that of the first connection member 130. In the present embodiment, the base substrate 150 may include a passivation layer 151, disposed on the second connection member 140 and having an opening, and an under-bump metal (UBM) layer 175 may be connected the lower redistribution layer 145 through the opening. For example, the UBM layer 175 may be formed in the opening of the passivation layer 151 by a metallization method, but example embodiments are not limited thereto. An external connection metal 179 may serve to physically and/or electrically connect the semiconductor package 100 to an external device such as a main board of an electronic device. The external connection metal 179 may include a low-melting-point metal, for example, a solder such as tin-aluminum-copper (Sn—Al—Cu). The external connection metal 179 may have a multi-layer structure or a single-layer structure. For example, the multilayer structure may include a copper pillar and a solder, and the single-layer structure may include a tin-silver solder or copper.

A plurality of vertical interconnectors 165 may be disposed on the base substrate 150 to connect the lower redistribution layer 145 and the upper redistribution layer 135 to each other.

As illustrated in FIG. 2, the plurality of vertical interconnects 165 may be arranged in a plurality of columns around the lower semiconductor chip 120. The plurality of vertical interconnections 165 are illustrated as being arranged in two rows or columns along all sides of the lower semiconductor chip 120. In another embodiment, the plurality of vertical interconnections 165 may be arranged along only some sides of the lower semiconductor chip 120 (for example, opposite sides) and may be arranged in a different number of columns. In some embodiments, the vertical interconnects 165 may include metal posts (for example, copper (Cu)) and may be formed by a plating process.

The semiconductor package 100 may include a molding portion 180 disposed on the base substrate 150 to surround the lower semiconductor chip 120 and the plurality of vertical interconnections 165. The molding portion 180 may extend upwardly along or of side surfaces of the upper semiconductor chip 110 and the upper redistribution layer 135.

As illustrated in FIG. 1, the molding portion 180 employed in the present embodiment may be divided into a first portion 180A, surrounding the lower semiconductor chip 120 and the plurality of vertical interconnections 165, and a second portion 180B extending upwardly along or of side surfaces of the upper semiconductor chip 110 and the upper redistribution layer 135. In the present embodiment, the second portion 180B of the molding portion 180 may be formed to surround the entire side surfaces of the upper semiconductor chip 110 and the upper redistribution layer 135.

The second portion 180B of the molding portion 180 may protect the upper semiconductor chip 110 and the upper redistribution layer 135 while securing firm coupling to the upper semiconductor chip 110. For example, the thickness t of the second portion 180B may be in a range of 10 μm to 300 μm. The molding portion 180 may be formed of a curable resin or a PID. The molding portion 180 may include, for example, epoxy mold compound (EMC).

In the present embodiment, the upper semiconductor chip 110 may be exposed from an upper surface 180T of the molding portion 180, for example, an upper surface of the second portion 180B. The inactive surface 110B of the upper semiconductor chip 110 may have a coplanar or substantially coplanar surface as the upper surface 180T of the molding portion 180. As described above, the upper semiconductor chip 110 may secure a heat dissipation path through the exposed inactive surface 110B. In addition, the molding portion 180 may have a side surface, coplanar or substantially coplanar with the side surface of the base substrate 150, for example, the second connection member 140.

In the present embodiment, the molding portion 180 may have a portion covering the active surface 120A of the lower semiconductor chip 120. A plurality of conductive posts 195 may be disposed on the connection pads 125 to penetrate through the covering portion of the molding portion 180, respectively. Referring to FIG. 3B, the connection pads 125 of the lower semiconductor chip 120 may be connected to the lower redistribution layer 145 through the plurality of conductive posts 195. Some vias 143 of the lower redistribution layer 145 may be directly connected to each of the plurality of conductive posts 195.

Referring to FIGS. 3A and 3B together with FIG. 1, the upper and lower semiconductor chips 110 and 120 may include semiconductor substrates 111 and 121, respectively. The active surfaces 110A and 120A of the semiconductor substrates 111 and 121 may include a plurality of active/passive devices (for example, transistors), and interconnection structures 113 and 123 may be disposed on the active surfaces 110A and 120A to connect the devices and the connection pads 115 and 125 to each other. The interconnection structure may include an insulating layer and a multilayer interconnection layer implemented in the insulating layer.

In some embodiments, the upper and lower semiconductor chips 110 and 120 may be processor chips or memory chips. For example, the upper semiconductor chip 110 may include a microprocessor, a graphics processor, a signal processor, a network processor, a chipset, an audio codec, a video codec, an application processor, or a system on chip, but example embodiments are not limited thereto. For example, the upper semiconductor chip 110 may be a control chip for driving a memory device.

In some embodiments, the lower semiconductor chip 120 may be a volatile memory chip and/or a nonvolatile memory chip. For example, the volatile memory chip may include a dynamic random access memory (DRAM), a static RAM (SRAM), a thyristor RAM (TRAM), a zero capacitor RAM (ZRAM), or twin transistor RAM (TTRAM). The nonvolatile memory chips may include, for example, a flash memory, a magnetic RAM (MRAM), a spin-transfer torque MRAM (STT-MRAM), a ferroelectric RAM (FRAM), a phase change RAM (PRAM), and a resistive RAM (RRAM), a nanotube RRAM, a polymer RAM, a nano-floating gate memory, a holographic memory, a molecular electronics memory, or an insulation resistance change memory.

As described above, the redistribution structure may be divided into upper and lower redistribution layers 130 and 140 for the upper and lower semiconductor chips 110 and 120 disposed on different levels, so that a relatively low thickness may be implemented to improve heat dissipation performance through the redistribution structure and the upper surface 110T of the upper semiconductor chip 110 may be exposed to the upper surface 180T of the molding portion 180 to secure smooth heat dissipation. In particular, since smooth heat dissipation is secured when the upper semiconductor chip 110 is a chip (a processor chip or a control chip) having a large amount of heat to be dissipated, an adverse effect on device operation and reliability of a lower semiconductor chip (for example, a memory chip), caused by heat dissipation of the upper semiconductor chip 110, may be reduced.

Figure 4:
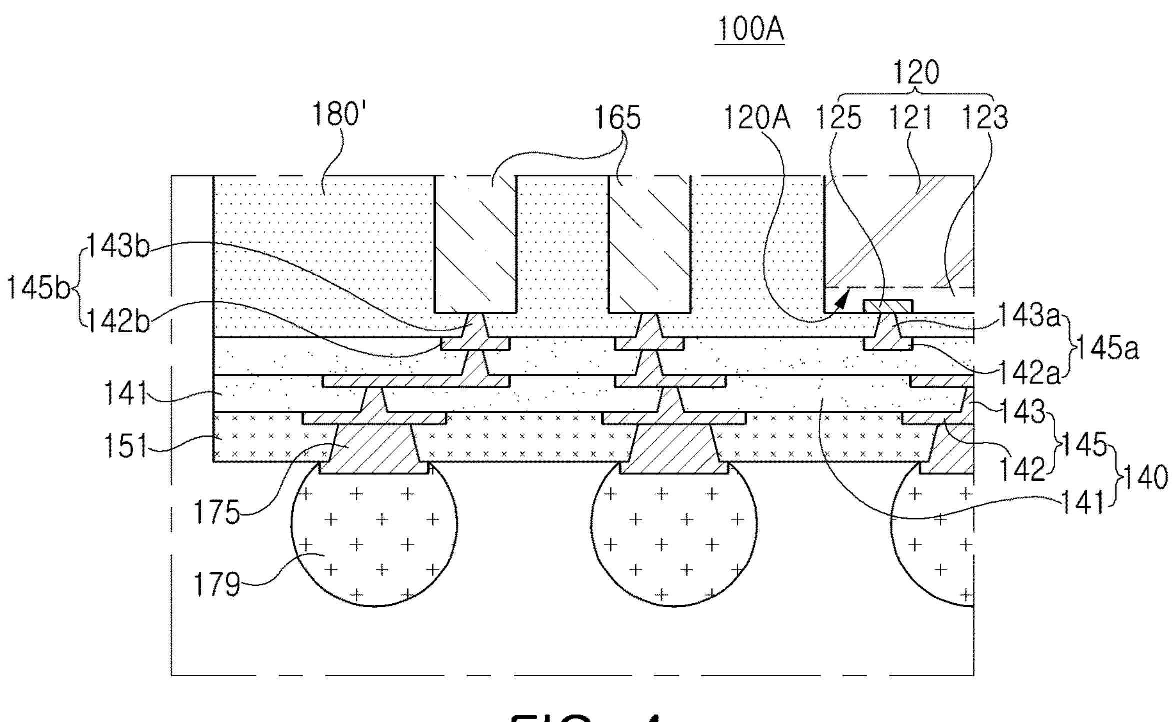
FIG. 4 is a partially enlarged view of a semiconductor package according to an example embodiment.

FIG. 4 is a partially enlarged view of a semiconductor package according to an example embodiment and may be understood as an enlarged view of portion "B" of the semiconductor package illustrated in FIG. 1, similar to FIG. 3B.

Referring to FIG. 4, a semiconductor package 100A according to the present embodiment may be understood to have a structure similar to the structure of the example embodiment illustrated in FIGS. 1 to 3B, except that a lower redistribution layer 145 has a different connection structure between a lower semiconductor chip 120 and a vertical interconnector 165. Accordingly, the description of the example embodiment illustrated in FIGS. 1 to 3B may be incorporated in the description of the present embodiment unless otherwise specified.

The lower redistribution layer 145 may be connected to the connection pads 125 and the vertical interconnections 165 of the lower semiconductor chip 120 by first and second vias 143*a* and 143*b*. The first and second vias 143*a* and 143*b* may be first-level redistribution layers 145*a* and 145*b* integrated with first and second redistribution patterns 142*a* and 142*b*. The molding portion 180' employed in the present embodiment may have an opening connecting the connection pads 125 and the vertical interconnections 165, and the first-level redistribution layers 145*a* and 145*b* may be disposed on the molding portion 180' to be connected to the connection pads 125 and the vertical interconnects 165 through the openings. For example, the molding portion 180' may use a photosensitive insulating material such as a PID. As described above, lower redistribution layers disposed on the molding portions 180 and 180' may be connected to the connection pads 125 and the vertical interconnections 165 of the lower semiconductor chip 120 in various manners, respectively.

Figure 5:
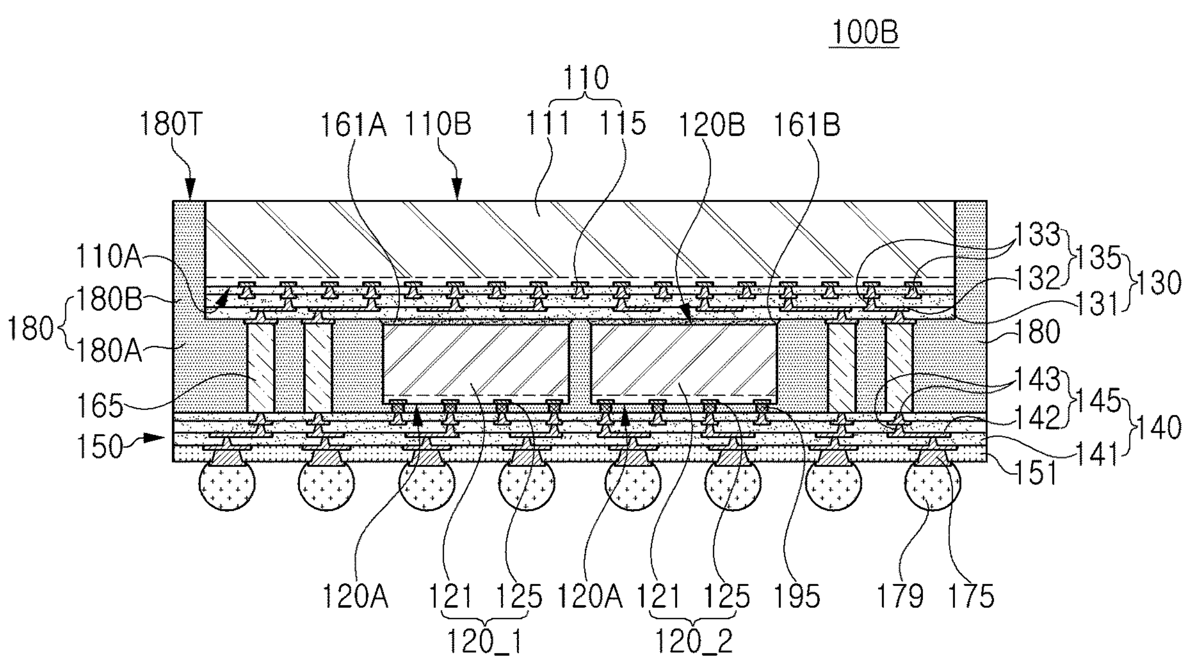
FIG. 5 is a side cross-sectional view of a semiconductor package according to an example embodiment.
Figure 6:
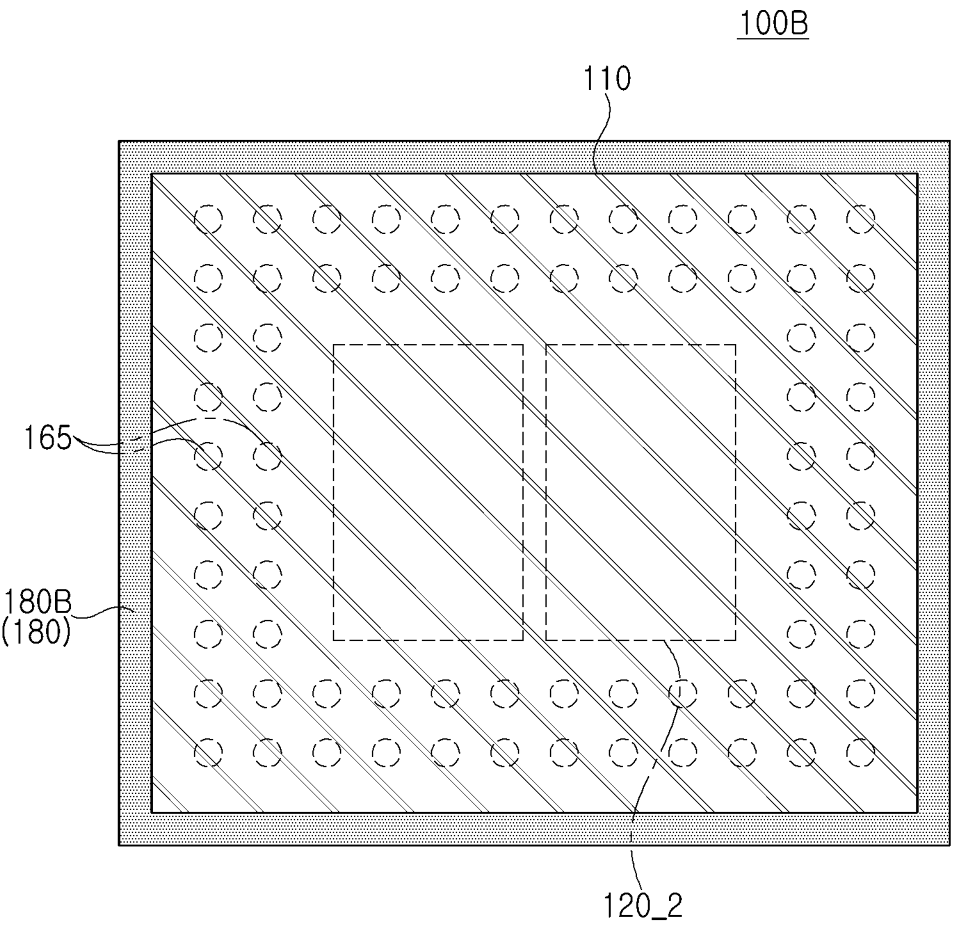
FIG. 6 is a plan view of the semiconductor package illustrated in FIG. 5.

FIG. 5 is a side cross-sectional view of a semiconductor package according to an example embodiment, and FIG. 6 is a plan view illustrating the semiconductor package illustrated in FIG. 5.

Referring to FIGS. 5 and 6, the semiconductor package 100B according to the present embodiment may be understood to have a structure similar to the structure of the example embodiment illustrated in FIGS. 1 to 4, except that the semiconductor package 100B includes a plurality of lower semiconductor chips 120_1 and 120_2. Accordingly, the description of the embodiment illustrated in FIGS. 1 to 4 may be incorporated in the description of the present embodiment unless otherwise specified.

The semiconductor package 100B may include first and second lower semiconductor chips 120_1 and 120_2. For example, the first and second lower semiconductor chips 120_1 and 120_2 may be memory chips. Each of the first and second lower semiconductor chips 120_1 and 120_2 may have an active surface 120A, on which connection pads 125 are arranged, and an inactive surface 120B opposite the active surface 120A. Similar to the previous embodiment, the semiconductor package 100B may further include first and second bonding layers 161A and 161B disposed between the inactive surface 120B of the first and second lower semiconductor chips 120_1 and 120_2 and the first connection member 130. For example, the first and second bonding layers 161A and 161B may include a direct adhesive film (DAF) or a film over wire (FOW).

The first and second lower semiconductor chips 120_1 and 120_2 may be disposed on one region of a base substrate 150 such that the active surfaces 120A of the first and second lower semiconductor chips 120_1 and 120_2 are directed toward or face an upper surface of the base substrate 150. Each of the connection pads 125 of the first and second lower semiconductor chips 120_1 and 120_2 may be connected to the lower redistribution layer 145. As described above, the first and second lower semiconductor chips 120_1 and 120_2, disposed between the upper semiconductor chip 110 and the base substrate 150, may be provided as a plurality of lower semiconductor chips.

In addition, vertical interconnectors 165 may be disposed around the first and second lower semiconductor chips 120_1 and 120_2 to connect the lower redistribution layer 145 and the upper redistribution layer 135, as illustrated in FIG. 6. The plurality of vertical interconnects 165 are illustrated as being arranged in two rows or columns to surround the first and second lower semiconductor chips 120_1 and 120_2, but may have various other arrangements in other embodiments. For example, the plurality of vertical interconnects 165 may also be arranged between the first and second lower semiconductor chips 120_1 and 120_2, as illustrated in FIG. 7.

Figure 7:
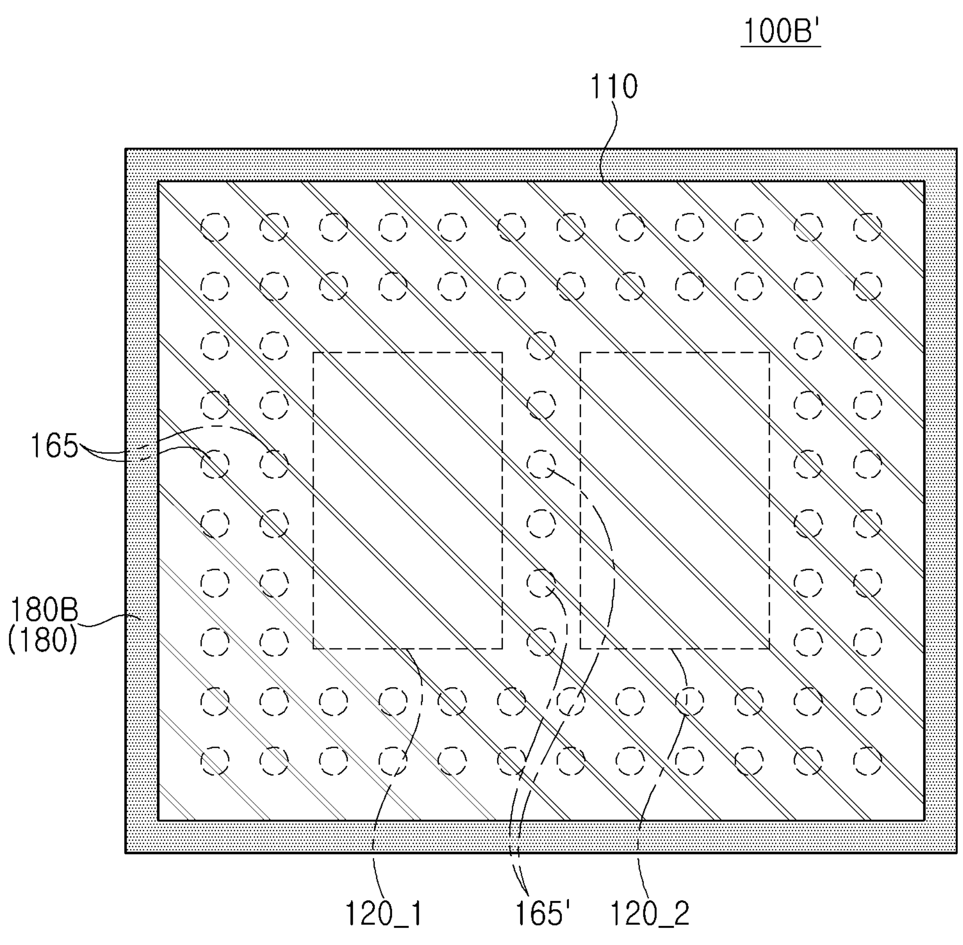
FIG. 7 is a plan view of a semiconductor package according to an example embodiment.

Referring to FIG. 7, a semiconductor package 100B' according to the present embodiment may includes a single upper semiconductor chip 110 and two lower semiconductor chips 120_1 and 120_2, similar to the semiconductor package 100B illustrated in FIG. 5. The vertical interconnectors 165 employed in the present embodiment may include vertical interconnects 165' arranged between the first and second lower semiconductor chips 120_1 and 120_2. As described above, the vertical interconnectors 165 may have various arrangements.

Figure 8:
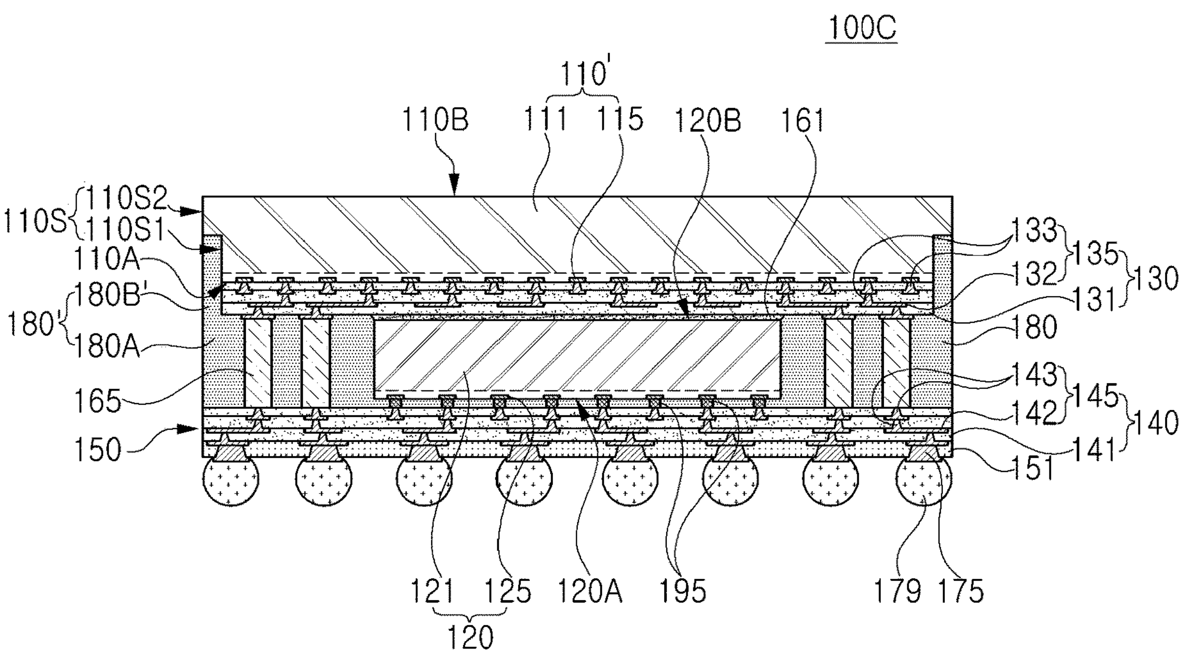
FIG. 8 is a side cross-sectional view of a semiconductor package according to an example embodiment.
Figure 9:
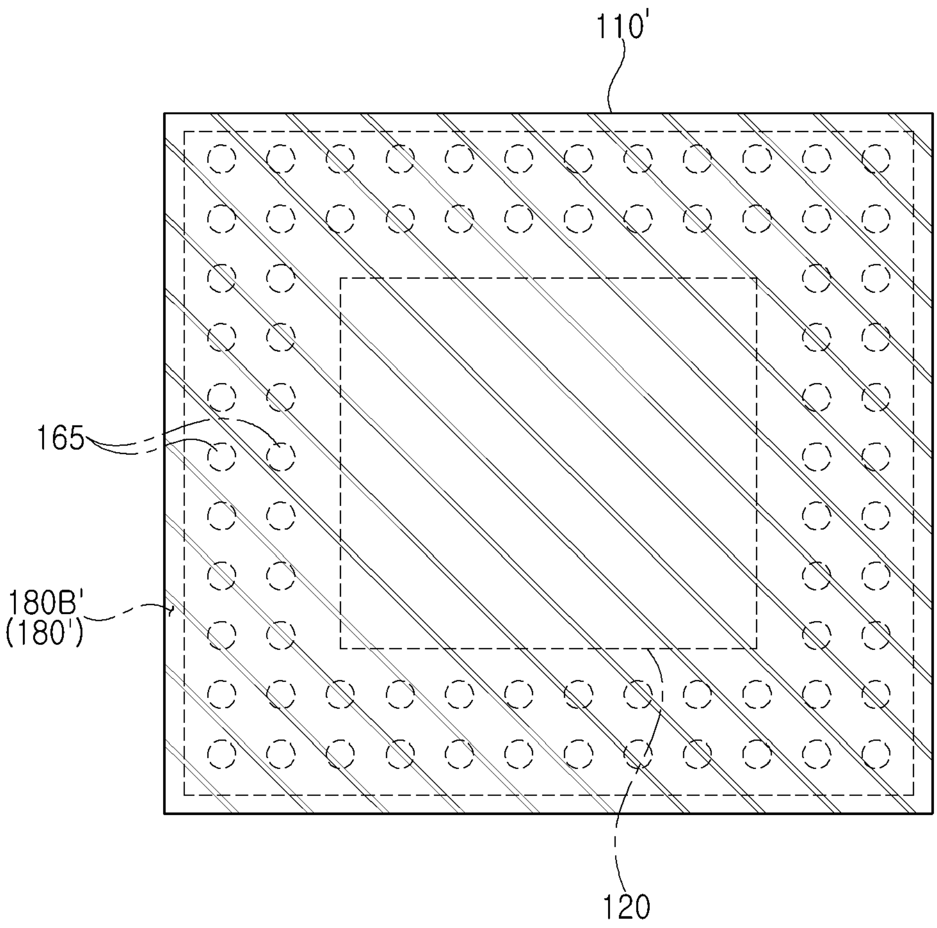
FIG. 9 is a plan view of the semiconductor package illustrated in FIG. 8.

FIG. 8 is a side cross-sectional view of a semiconductor package according to an example embodiment, and FIG. 9 is a plan view of the semiconductor package illustrated in FIG. 8.

Referring to FIGS. 8 and 9, a semiconductor package 100C according to the present embodiment may be understood to have a structure similar to the structure of the example embodiment illustrated in FIGS. 1 to 4, except that a side surface 110S of an upper semiconductor chip 110' has a step structure and a molding portion 180' extends to only a portion or region of the side surface 110S of the upper semiconductor chip 110'. Accordingly, the description of the embodiment illustrated in FIGS. 1 to 4 may be incorporated in the description of the present embodiment unless otherwise specified.

In the present embodiment, the molding portion 180' may extend to only a region of the side surface 110S of the upper semiconductor chip 110', unlike the previous embodiment. The side surface 110S of the upper semiconductor chip 110' employed in the present embodiment may have a step structure including a first side portion 110S1, having a first width, and a second side portion 110S2 having a second width, greater than the first width. The molding portion 180' may include a first portion 180A, surrounding the lower semiconductor chip 120 and the vertical interconnectors 165 on the base substrate 150, and a second portion 180B' extending to a first connection member 130 and the first side portion 110S1 of the upper semiconductor chip 110'.

The second side portion 110S2 of the upper semiconductor chip 110' may be exposed from a side surface of the molding portion 180'. The second side portion 110S2 of the upper semiconductor chip 110' may have a substantially flat surface, e.g., coplanar with the side surface of the molding portion 180'. A base substrate 150 may have a substantially flat side surface, e.g., coplanar with the side surface of the molding portion 180'.

FIGS. 10A to 10D are side cross-sectional views illustrating some processes, among main processes, of a method of manufacturing a semiconductor package according to an example embodiment.

Figure 10A:
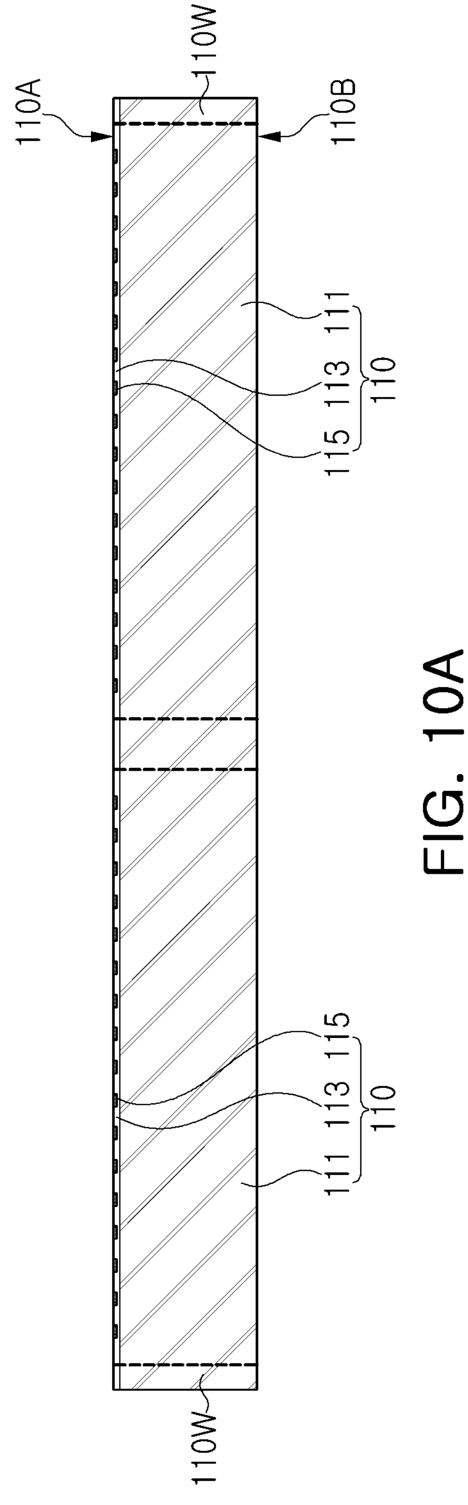
FIGS. 10A to 10D are side cross-sectional views illustrating some processes, among main processes, of a method of manufacturing a semiconductor package according to an example embodiment.

Referring to FIG. 10A, a wafer 110W including a plurality of first semiconductor chips 110 implemented thereon may be provided. A region, indicated by dashed lines, represents the first semiconductor chip 110 implemented on the wafer 110W.

The plurality of first semiconductor chips 110, implemented on the wafer 110W, may have an active surface (also referred to as a "first surface of the wafer 100W") 100A, on which first connection pads 115 are arranged, and an inactive surface (also referred to as a "second surface of the wafer 100W") 100B opposite the active surface 110A. Each of the first semiconductor chips 110 may include a semiconductor substrate 111, having an active surface 110A on which a plurality of devices are implemented, and an interconnection structure 113 disposed on the active surface (or an upper surface) 110A of the semiconductor substrate 111 to connect the plurality of devices and the first connection pads 115 to each other.

In some embodiments, the first semiconductor chip 110 may be a processor chip. For example, the first semiconductor chip 110 may be a microprocessor, a graphics processor, a signal processor, a network processor, a chipset, an audio codec, a video codec, an application processor, a system on chip, or a control chip for driving a memory device.

Figure 10B:
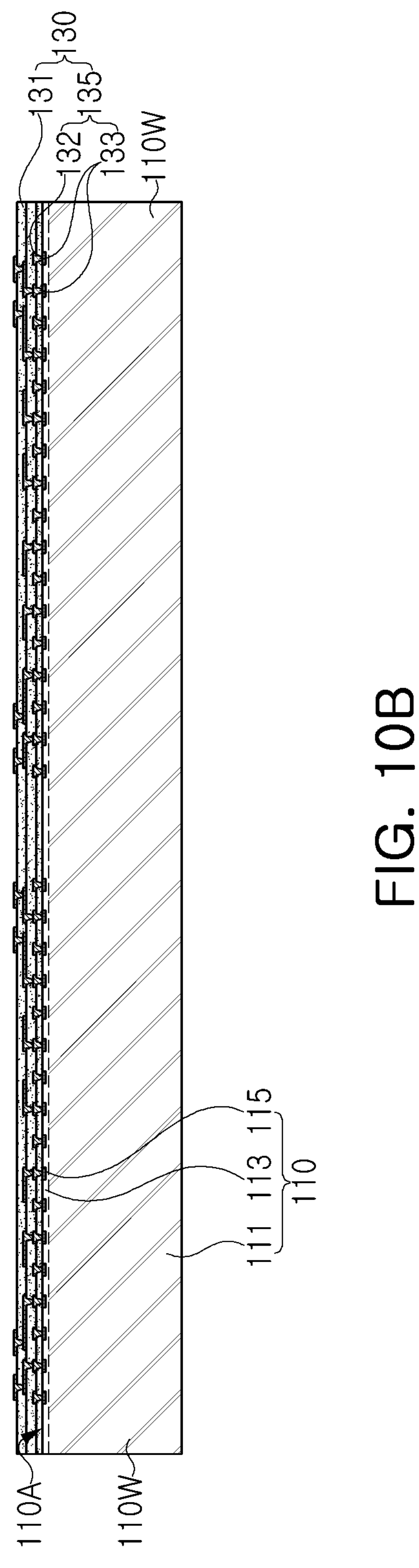

Referring to FIG. 10B, a first connection member 130 may be formed on the first surface 110A of the wafer 110W.

The first connection member 130 may include a plurality of insulating layers 131 and a first redistribution layer 135 disposed on the plurality of insulating layers 131 and connected to the first connection pads 115. The first redistribution layer 135 may include a plurality of redistribution patterns 132, respectively disposed on the plurality of insulating layers 131, and a plurality of vias 133 penetrating through each of the insulating layers 131 to connect adjacent redistribution patterns 132. For example, the insulating layers 131 may be formed of a photosensitive insulating material such as a PID resin, and the first redistribution layer 135 may include a conductive material such as copper (Cu), aluminum (Al), silver (Ag), tin (Sn), gold (Au), nickel (Ni), lead (Pb), titanium (Ti), or alloys thereof. The redistribution pattern 132 and the via 133 may be formed in an integrated structure through the same plating process on each level. Each of the vias 133, formed by the plating process, may have a width that decreases in a direction toward the active surface 110A of the first semiconductor chip 110.

In the present process, since the first connection member 130 is directly formed on the first surface 110A of the wafer 110W, the first semiconductor chip 110 may be directly connected to the first redistribution layer 135 through the via 133 of the first redistribution layer 135 without an external connection conductive material such as a solder.

Figure 10C:
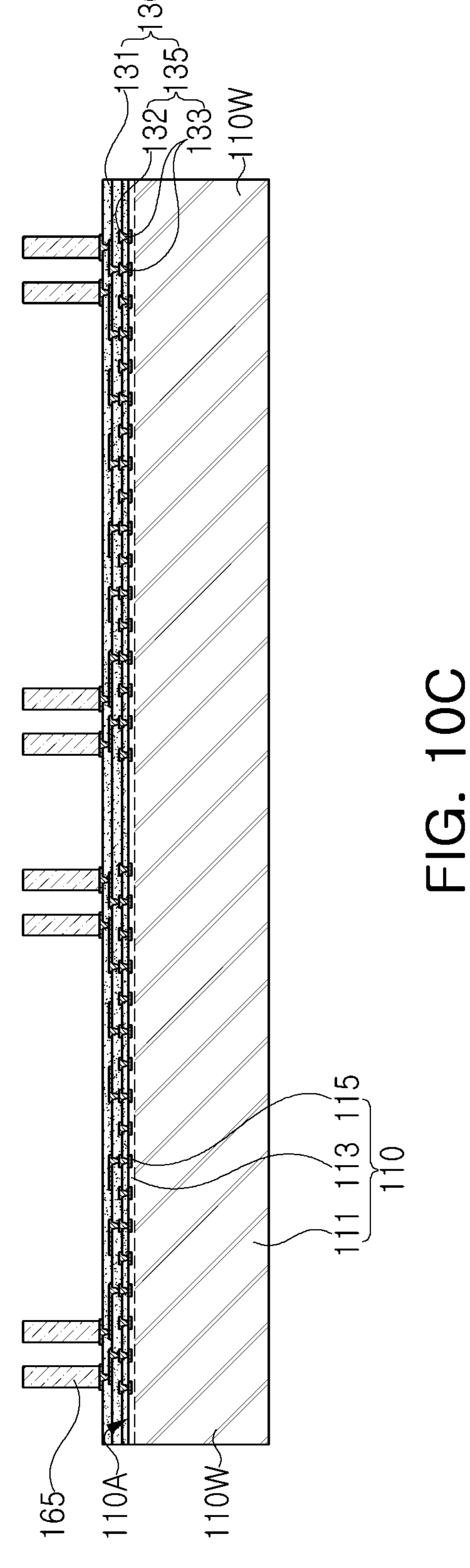

Referring to FIG. 10C, a plurality of vertical interconnectors 165 may be formed on regions corresponding to the plurality of first semiconductor chips 110 in the first connection member 130.

The vertical interconnectors 165 may be formed to have a height greater than a mounting height of a second semiconductor chip (120 of FIG. 11A) to be disposed in a subsequent process. In some embodiments, the plurality of vertical interconnects 165 may be formed by a plating process using a photoresist. For example, after a seed layer (for example, a titanium (Ti) layer) is formed on the first connection member 130, a photoresist may be formed and an opening may be formed in the photoresist to expose a region in which the vertical interconnector 165 is to be formed. A connection region of the first redistribution layer 135 may be exposed through the opening. A vertical interconnect 165, a post structure, may be formed in the region, exposed by the opening, by a plating process. The photoresist may be stripped to form a vertical interconnector 165 electrically connected to the first redistribution layer 135, as illustrated in FIG. 10C.

Figure 10D:
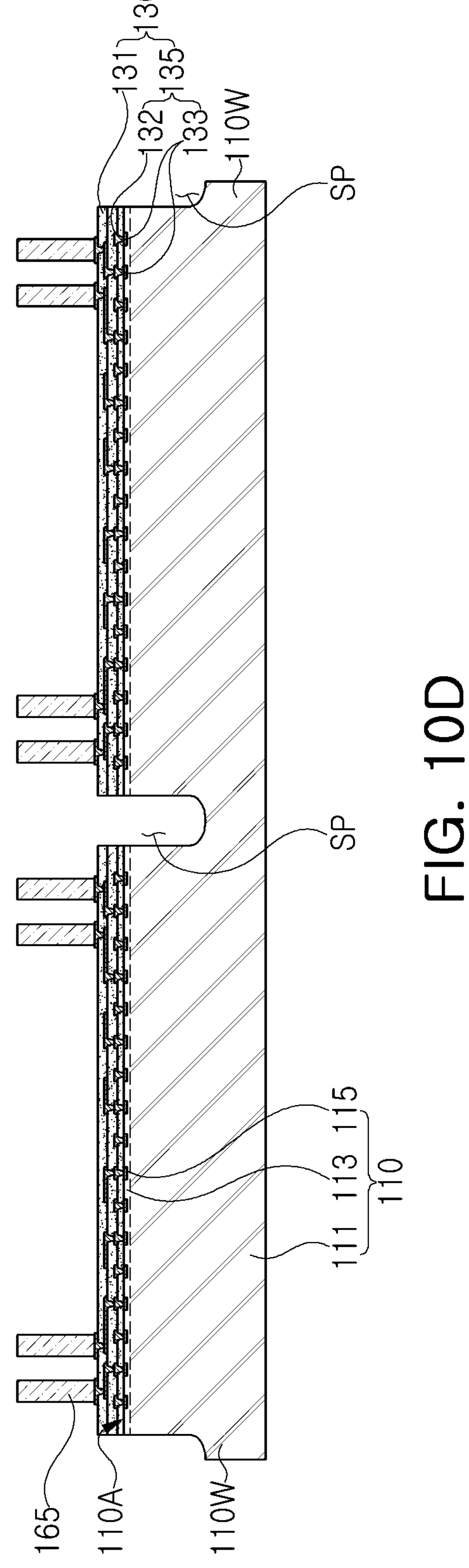

Referring to FIG. 10D, the wafer 110W may be partially cut to be divided into a plurality of semiconductor chips 110.

Since such a partial cutting process is performed on the first surface 110A of the wafer 110W, the first connection member 130 may also be divided into regions corresponding to the plurality of first semiconductor chips 110. Such a partial cutting process may be performed using a mechanical cutting and/or etching process. For example, in such a partial cutting process, a plasma treatment may be applied after cutting the wafer 110W to a predetermined depth using a blade. Regions of wafer, damaged during a partial cutting process, may be removed by a plasma treatment. In such a partial cutting process, a seed layer remaining after the photoresist is removed in the previous process may be used as a mask to protect the first connection member 130. In addition, such a plasma treatment may be used to remove the remaining seed layer together with the damaged regions. In some embodiments (for example, FIG. 1), in the present process, a depth or thickness of the partially cut wafer 110W may be greater than a desired thickness of the first semiconductor chip 110. In other embodiments (for example, FIG. 8), a depth or thickness of the partially cut wafer 110W may be smaller than a desired first semiconductor chip 110.

FIGS. 11A to 11D are side cross-sectional views illustrating some processes, among main processes, of a method of manufacturing a semiconductor package according to an example embodiment.

Figure 11A:
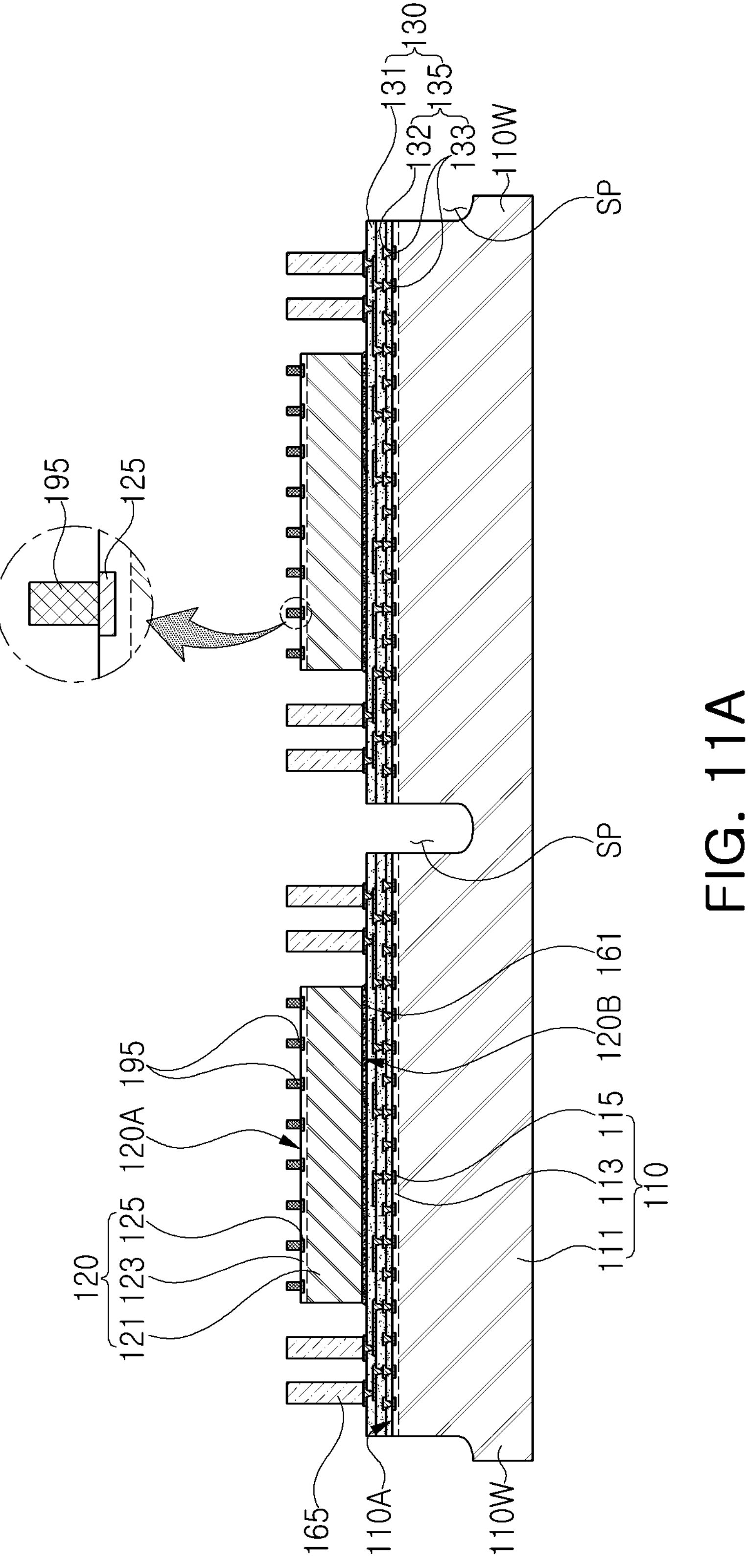
FIGS. 11A to 11D are side cross-sectional views illustrating some processes, among main processes, of a method of manufacturing a semiconductor package according to an example embodiment.

Referring to FIG. 11A, in a first connection member 130, second semiconductor chips 120 may be disposed on regions corresponding to a plurality of first semiconductor chips 110, respectively.

Each of the second semiconductor chips 120 may have an active surface 120A, on which second connection pads 125 are arranged, and an inactive surface 120B opposite the active surface 120A. Each of the second semiconductor chips 120 may include a semiconductor substrate 121, having an active surface 120A on which a plurality of devices are implemented, and an interconnection structure 123 disposed on the active surface 120A of the semiconductor substrate 121 to connect a plurality of devices and second connection pads 125 to each other. In some embodiments, the second semiconductor chip 120 may be a memory chip. For example, the second semiconductor chip 120 may be a volatile memory chip and/or a nonvolatile memory chip.

The second semiconductor chip 120 may be disposed on the first connection member 130 such that the second connection pads 125 are directed upwardly. As illustrated in FIG. 11A, the second semiconductor chip 120 may be disposed on some regions, among regions corresponding to the plurality of first semiconductor chips 110, in the first connection member 130. The second semiconductor chip 120 may have an area smaller than that of the first semiconductor chip 110. In some embodiments, the second semiconductor chip 120 may include a plurality of second semiconductor chips. The inactive surface 120B of the second semiconductor chip 120 may be bonded to the first connection member 130 using a bonding layer 161. For example, the bonding layer 161 may include a DAF or a FOW.

In the present embodiment, after the second semiconductor chip 120 is disposed, a conductive post (or a bump) 195 may be formed on each of the second connection pads 125. In some embodiments, the conductive posts 195 may be formed at a height greater than or equal to an upper end level of a vertical connection structure.

Figure 11B:
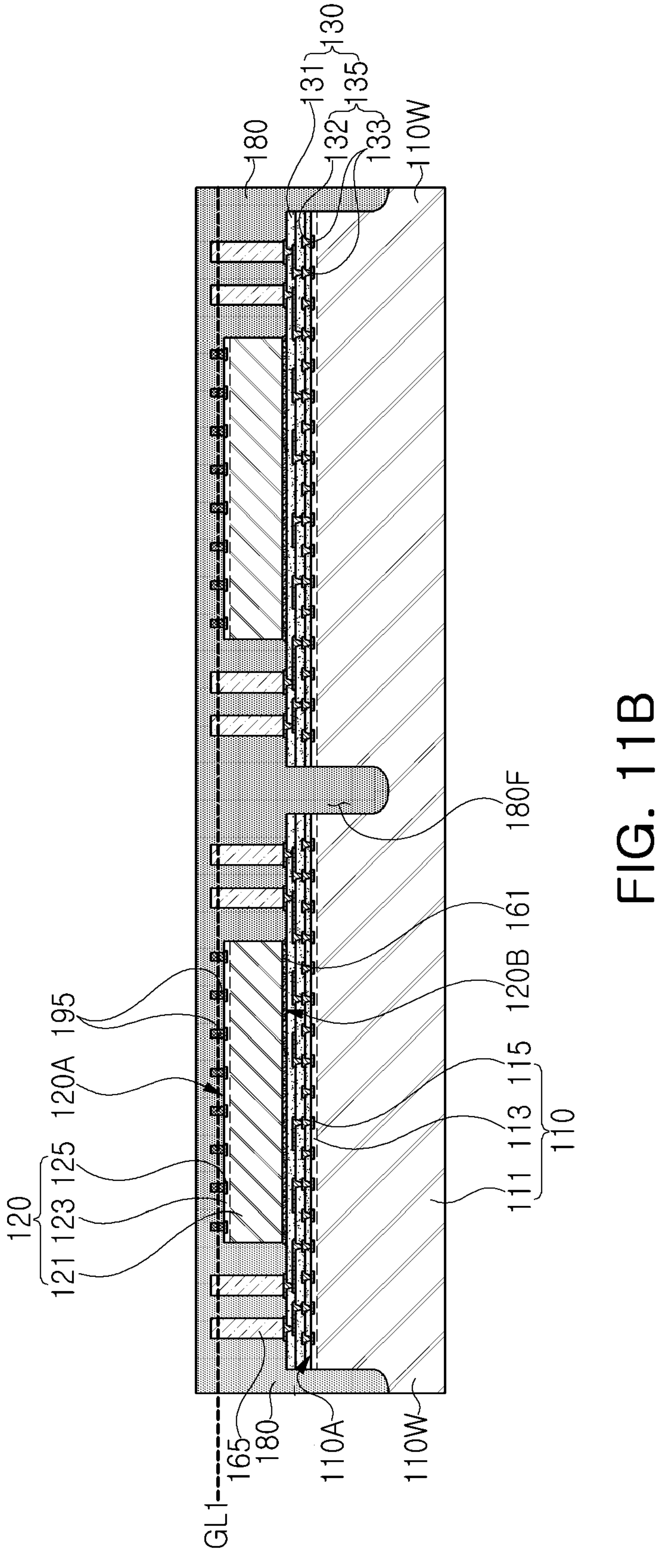

Referring to FIG. 11B, a molding layer or portion 180 may be formed on the first surface 110A of the wafer 110W to cover the first connection member 130, the vertical interconnectors 165, and the second semiconductor chip 120.

The molding portion 180 may have a portion 180F filling a space SP (see FIG. 11A) obtained in the previous partial separation process. The filling portion 180F of the molding portion 180 may extend to a portion of a side surface of the wafer 100W along a side surface of the first redistribution layer 135. The molding portion 180 may be formed to surround the second semiconductor chip 120 and the vertical interconnectors 165. In addition, in the present embodiment, the molding portion 180 may cover the conductive posts 195. For example, the molding portion 180 may include an EMC or a PID.

In a subsequent process, the molding portion 180 may be grinded to line "GL1" to expose the vertical interconnectors 165 and the conductive posts 195. Exposed upper surfaces of the vertical interconnects 165 and the conductive posts 195 may provide a contact region with the second redistribution layer (145 of FIG. 11C) to be formed in a subsequent process.

Figure 11C:
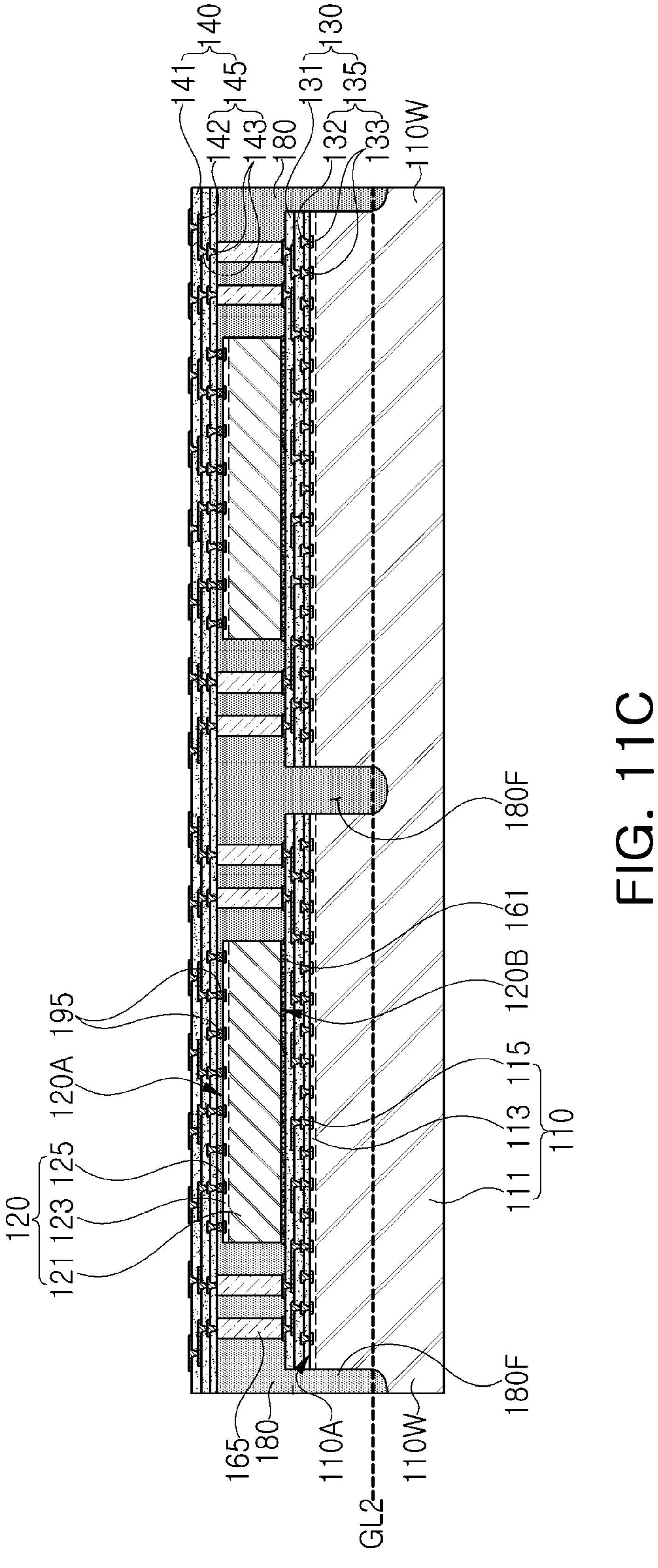

Referring to FIG. 11C, a second connection member 140 including a second redistribution layer 145 may be formed on the ground surface of the molding portion 180.

Similar to the first connection member 130, the second connection member 140 may include a plurality of insulating layers 141. Similar to the first redistribution layer 135, the second redistribution layer 145 may include redistribution patterns 142, respectively disposed on the plurality of insulating layers 141, and a plurality of vias 143 penetrating through each of the insulating layers 141 to connect adjacent redistribution patterns 142 to each other. For example, the insulating layers 141 may be formed of a photosensitive insulating material such as a PID resin, and the second redistribution layer 145 may include a conductive material such as copper (Cu), aluminum (Al), silver (Ag), tin (Sn), gold (Au), nickel (Ni), lead (Pb), titanium (Ti), or alloys thereof. The redistribution pattern 142 and the via 143 may be formed in an integrated structure by the same plating process on each level. The vias 143, formed by the plating process, may each have a width that decreases in a direction toward the active surface 120A of the second semiconductor chip 120.

The second redistribution layer 145 may be connected to exposed upper surfaces of the vertical interconnect 165 and the conductive post 195 by some vias 143. In the present embodiment, the second connection pads 125 of the second semiconductor chip 120 may be connected to the second redistribution layer 145 through the conductive posts 195. However, example embodiments are not limited thereto and, in another embodiment, the second connection pads 125 may be directly connected to the vias 143 of the second redistribution layer 145.

In a subsequent process, a grinding process may be performed on the second surface 110B of the wafer 110W to line "GL2" to expose the filling portion 180F of the molding portion 180.

Figure 11D:
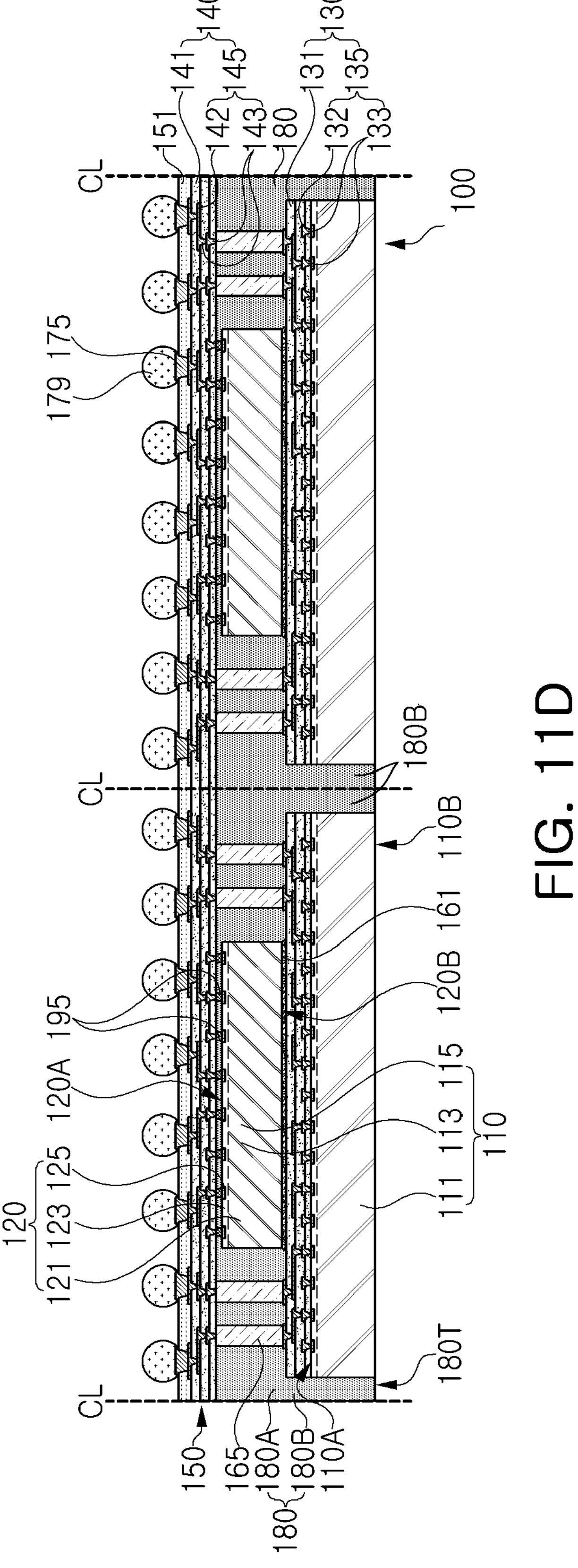

Referring to FIG. 11D, the wafer 110W may be ground to line "GL2" to expose the filling portion 180F of the molding portion 180, and then a plurality of semiconductor packages 100 may be manufactured using a cutting process.

Before the cutting process, the method may include processes of forming a passivation layer 151, a UBM layer 175, and an external connection conductor 179. Such processes may be performed before or after the wafer (W) grinding process.

The wafer W may be completely divided into a plurality of first semiconductor chips 120 by the wafer (W) grinding process, and a thickness of the first semiconductor chip 120 may be determined. In addition, the ground surface may be provided as an upper surface of a final semiconductor package. Since the first semiconductor chip 110 is exposed from an upper surface 180T of the molding portion 180, for example, an upper surface of the second portion 180B, the first semiconductor chip 110 may secure a sufficient heat dissipation path.

Side surfaces of the plurality of divided first semiconductor chips 120 may be surrounded by the second portion 180B of the molding portion 180, respectively. In the semiconductor package 100 obtained after the cutting process along line "CL," the first connection member 130 may have a side surface, coplanar or substantially coplanar with a side surface of the first semiconductor chip 110. In addition, the molding portion 180 may have a side surface, coplanar or substantially coplanar with a side surface of the base substrate 150, for example, the second connection member 140.

As described above, according to example embodiments, a redistribution structure may be divided into upper and lower redistribution layers for semiconductor chips having different levels while maintaining a stack arrangement of a plurality of semiconductor chips. Thus, a semiconductor package advantageous for heat dissipation performance may be provided. In some embodiments, an upper surface of the upper semiconductor chip may be exposed through an upper surface of a molding portion to secure smooth heat dissipation.

While example embodiments have been shown and described above, it will be apparent to those skilled in the art that modifications and variations could be made without departing from the scope of the present inventive concept as defined by the appended claims.

What is claimed is:

1. A semiconductor package comprising:

a lower redistribution layer;

a lower semiconductor chip including a first active surface with first connection pads thereon, the lower semiconductor chip on the lower redistribution layer such that the first active surface faces an upper surface of the lower redistribution layer, each of the first connection pads being connected to the lower redistribution layer;

an upper semiconductor chip including a second active surface with second connection pads thereon, the upper semiconductor chip on the lower semiconductor chip such that the second active surface faces the lower semiconductor chip, the upper semiconductor chip having an area larger than an area of the lower semiconductor chip;

an intermediate connection member including an upper redistribution layer on the second active surface of the upper semiconductor chip between the lower semiconductor chip and the upper semiconductor chip and connected to the second connection pads;

a plurality of vertical interconnectors disposed around the lower semiconductor chip on the lower redistribution layer and connecting the lower redistribution layer and the upper redistribution layer; and a molding portion on the lower redistribution layer and including a first portion surrounding the lower semiconductor chip and the plurality of vertical interconnectors, and a second portion extending from the first portion and on side surfaces of the upper semiconductor chip and the intermediate connection member, wherein the lower redistribution layer has an area larger than an area of the intermediate connection member, wherein the lower redistribution layer includes an outside surface that is substantially coplanar with an outside surface of the molding portion, and wherein the outside surface of the molding portion is exposed to the outside.

2. The semiconductor package of claim 1, wherein:

the second portion of the molding portion has a thickness ranging from 10 μm to 300 μm.

3. The semiconductor package of claim 1, wherein:

the second portion of the molding portion surrounds an entirety of the side surfaces of the upper semiconductor chip and the intermediate connection member.

4. The semiconductor package of claim 1, wherein:

the upper semiconductor chip includes a second inactive surface opposite the second active surface; and the second inactive surface of the upper semiconductor chip is substantially coplanar with an upper surface of the second portion of the molding portion.

5. The semiconductor package of claim 1, wherein:

the intermediate connection member has an area corresponding to that of the second active surface of the upper semiconductor chip.

6. The semiconductor package of claim 1, wherein:

the lower semiconductor chip includes a plurality of semiconductor chips.

7. The semiconductor package of claim 1, wherein:

the upper redistribution layer includes a plurality of redistribution patterns and a plurality of vias connected to the plurality of redistribution patterns; and the plurality of vias include vias that are directly connected to the second connection pads.

8. The semiconductor package of claim 1, wherein:

the molding portion includes a third portion covering the first active surface of the lower semiconductor chip; and the semiconductor package further comprises a plurality of conductive posts respectively disposed on the first connection pads and penetrating through the third portion of the molding portion, and the lower redistribution layer is connected to the plurality of conductive posts.

9. The semiconductor package of claim 1, wherein:

the lower redistribution layer includes a plurality of redistribution patterns and a plurality of vias connected to the plurality of redistribution patterns; and the plurality of vias include vias that are directly connected to the first connection pads.

10. The semiconductor package of claim 1, wherein:

the lower semiconductor chip includes a first inactive surface opposite the first active surface;

the semiconductor package further includes a bonding layer between the first inactive surface of the lower semiconductor chip and the intermediate connection member; and the bonding layer contacts each of the first inactive surface of the lower semiconductor chip and the intermediate connection member.

11. The semiconductor package of claim 1, wherein:

the lower semiconductor chip includes a memory chip, and the upper semiconductor chip includes a processor chip.

12. A semiconductor package comprising:

a lower redistribution layer;

a lower semiconductor chip including a first active surface with first connection pads thereon and a first inactive surface opposite the first active surface, the lower semiconductor chip on the lower redistribution layer such that the first active surface faces the lower redistribution layer, the first connection pads being connected to the lower redistribution layer;

an upper semiconductor chip having an area larger than an area of the lower semiconductor chip and including a second active surface with second connection pads thereon and a second inactive surface opposite the second active surface, the upper semiconductor chip on the lower semiconductor chip such that the second active surface faces the lower semiconductor chip;

an intermediate connection member including an upper redistribution layer on the second active surface of the upper semiconductor chip between the lower semiconductor chip and the upper semiconductor chip and connected to each of the second connection pads;

a plurality of vertical interconnectors disposed around the lower semiconductor chip on the lower redistribution layer and connecting the lower redistribution layer and the upper redistribution layer to each other; and a molding layer on the lower redistribution layer surrounding the lower semiconductor chip and the plurality of vertical interconnectors and extending upwardly along side surfaces of the upper semiconductor chip and the intermediate connection member, the molding layer including an upper surface that is substantially coplanar with the second inactive surface of the upper semiconductor chip, wherein the lower redistribution layer has an area larger than an area of the intermediate connection member, wherein the lower redistribution layer includes an outside surface that is substantially coplanar with an outside surface of the molding layer, and wherein the outside surface of the molding layer is exposed to the outside.

13. The semiconductor package of claim 12, wherein:

the molding layer includes a portion covering the first active surface of the lower semiconductor chip; and the semiconductor package further includes conductive posts penetrating through the portion of the molding layer covering the first active surface to connect each of the first connection pads of the lower semiconductor chip to the lower redistribution layer.

14. A semiconductor package comprising:

a first semiconductor chip including a first surface with first connection pads thereon and a second surface opposite the first surface;

a first connection member on the first surface of the first semiconductor chip and including a first redistribution layer electrically connected to the first connection pads, the first connection member having the same planar area as the first semiconductor chip;

a second semiconductor chip including a first surface with second connection pads thereon and a second surface opposite the first surface and bonded to one region of the first connection member;

a second redistribution layer on the first surface of the second semiconductor chip electrically connected to the second connection pads, the second redistribution layer having a planar area larger than a planar area of the first semiconductor chip;

a plurality of vertical interconnectors disposed around the second semiconductor chip on the second redistribution layer and connecting the first redistribution layer and the second redistribution layer to each other; and a molding portion on the second redistribution layer surrounding the second semiconductor chip and the plurality of vertical interconnectors and extending upwardly on side surfaces of the first semiconductor chip and the first connection member, wherein the first connection member is between the first semiconductor chip and the second semiconductor chip, wherein the second redistribution layer has an area larger than an area of the first connection member, wherein the semiconductor package further includes a bonding layer between the second surface of the second semiconductor chip and the first connection member, wherein the bonding layer contacts each of the second surface of the second semiconductor chip and the first connection member, wherein the molding portion includes an extended portion covering the first surface of the second semiconductor chip, the semiconductor package further comprises a plurality of conductive posts respectively disposed on the second connection pads and penetrating through the extended portion of the molding portion, and the second redistribution layer is connected to the plurality of conductive posts, and wherein an entire length of each of the plurality of conductive posts extending between the second connection pad and the second redistribution layer is in direct contact with the extended portion of the molding portion.

15. The semiconductor package of claim 14, wherein:

the first redistribution layer includes a plurality of first redistribution patterns and a plurality of vias connected to the plurality of first redistribution pattern, each of the plurality of vias having a width that decreases in a direction toward the first surface of the first semiconductor chip; and the plurality of vias include vias connected to the first connection pads.

16. The semiconductor package of claim 14, wherein:

the second redistribution layer includes a plurality of second redistribution patterns and a plurality of second vias connected to the plurality of second redistribution patterns, each of the plurality of second vias having a width that decreases in a direction toward the first surface of the second semiconductor chip; and the plurality of second vias include vias connected to the second connection pads.

17. The semiconductor package of claim 14, wherein:

the first surface of the first semiconductor chip is substantially coplanar with an upper surface of the molding portion.

18. The semiconductor package of claim 14, wherein the second redistribution layer includes an outside surface that is substantially coplanar with an outside surface of the molding portion, and wherein the outside surface of the molding portion is exposed to the outside.

19. The semiconductor package of claim 14, wherein:

the conductive posts contact first surfaces of the second connection pads; and the first surfaces of the second connection pads are substantially coplanar with the first surface of the second semiconductor chip.

* * * * *